United States Patent [19]

Gimlett

[11] Patent Number: 5,010,588
[45] Date of Patent: Apr. 23, 1991

[54] ULTRAWIDE-BANDWIDTH LOW-NOISE OPTICAL RECEIVER

[75] Inventor: James L. Gimlett, Holmdel, N.J.

[73] Assignee: Bell Communications Research, Inc., Livingston, N.J.

[21] Appl. No.: 318,844

[22] Filed: Mar. 6, 1989

Related U.S. Application Data

[63] Continuation-in-part of Ser. No. 166,267, Mar. 10, 1988, abandoned.

[51] Int. Cl.⁵ .......................................... H04B 10/06
[52] U.S. Cl. ..................................... 455/619; 330/59; 330/308; 330/311
[58] Field of Search ............... 455/606, 607, 617, 619; 330/59, 176, 302–303, 307–308, 310–311, 227

[56] References Cited

U.S. PATENT DOCUMENTS 4,295,225 10/1981 Pan .
4,423,388 12/1983 Crescenzi, Jr. et al. .
4,754,229 6/1988 Kawakami et al. .
4,771,247 9/1988 Jacomb-Hood .

OTHER PUBLICATIONS

"A New Low Noise 16 GHz PIN/HEMT Optical Receiver," J. L. Gimlett, Fourteenth European Conference on Optical Communication (ECOC 88), 11–15, Sep. 1988, conference publication No. 292–Part 2, Post-Deadline Papers, pp. 13–16.
"GaAs FET Ultrabroad-Band Amplifiers for Gbit/s Data Rate Systems", IEEE Trans., K. Honjo, Y. Takayama, Jul. 1981, vol. MTT-29, pp. 629–636.
"Deisgn and Performance of Monolithic GaAs Direct-Coupled Preamplifiers and Main Amplifiers", IEEE Trans., Y. Imai et al., 1985, vol. MIT-33, pp. 686–692, Aug. 1985.
"SAGM Avalanche Photodiode Optical Receiver for 2 Gbit/s and 4 Gbit/s", Electronics Letters, B. L. Kasper et al., 1985, vol. 21, pp. 982–984, Oct. 1985.
"Broadband GaAs FET Optical Front-End Circuit Up 5–6 GHz", Electronics Letters, N. Ohkawa et al., Jun. 1986, vol. 22, pp. 259–261.
"Balanced Dual-Detector Receiver for Optical Heterodyne Communications at Gbit/s Rates", Electronics Letters, B. L. Kasper, et al., 1986, vol. 22, pp. 413–415, Apr. 1986.
"Low Noise 8 GHz PIN/FET Optical Receiver", Electronics Letters, J. L. Gimlett, Mar. 12, 1987, vol. 23, No. 6, pp. 281–283.

Primary Examiner—Joseph A. Orsino
Assistant Examiner—L. Van Beek
Attorney, Agent, or Firm—Stephen M. Gurey

[57] ABSTRACT

An ultrawide-bandwidth, low-noise optical receiver is disclosed. The receiver comprises a photodiode (402) connected to a high-impedance three-stage (421, 422, 423) HEMT preamplifier through an inductive/resistive modified T-network (404) the latter circuit enhancing the high-frequency response of the first stage. Each stage includes an HEMT amplifier (408, 408, 410) and an interstage microwave matching circuit (405, 406, 407) configured as a modified T-network having wirebond inductances as the series-arm impedances and a coplanar waveguide in series with a resistor as the shunt-leg impedance. The first stage provides signal gain and transforms the high input impedance to an intermediate value. The second stage provides additional gain at the intermediate impedance level and the third stage provides output impedance matching to a conventional 50Ω system.

16 Claims, 4 Drawing Sheets

ULTRAWIDE-BANDWIDTH LOW-NOISE OPTICAL RECEIVER

BACKGROUND OF THE INVENTION

This application is a continuation-in-part of U.S. patent application Ser. No. 166,267, filed Mar. 10, 1988, now abandoned.

This invention relates to optical receivers, and more particularly to low-noise optical receivers operable over a very wide bandwidth from near dc to multigigahertz.

With the widespread deployment of high-capacity single-mode optical fibers in telecommunications networks, it is expected that very high-speed (>10 Gbit/s) optical transmission systems will be required as demand on capacity increases. The optical front-end receiver which receives the optical signal and converts it to an electrical signal from which additional circuitry detects the transmitted bit stream, is a critical component in these systems because of the simultaneous and often conflicting requirements of wide bandwidth and low noise. Ultra-wide bandwidth receivers are particularly important for future heterodyne communications systems because an optical heterodyne receiver, in general, requires a bandwidth of several times the data rate.

Unlike detection of signals transmitted over microwave or radio frequency facilities which require a receiver to have a flat frequency response only around a passband surrounding the carrier frequency, optical receivers, because of the nature of the optical signal, require a receiver that has a substantially flat frequency response down to the dc level. Accordingly, RF band technology can not be readily adapted to fiber optics applications. Therefore in high-speed multi-gigahertz baseband direct detection systems, an optical receiver must have what essentially is a flat response from dc to the multi-gigahertz frequencies. Similarly, in high-speed multi-gigahertz heterodyne systems, the optical receiver must also have a very wide bandwidth that extends to almost the dc level.

At the higher bandwidth frequencies, and in particular those that exceed 5 GHz, the design of optical receivers becomes increasingly difficult due to parasitic impedances in circuit components, particularly the parasitic capacitances associated with the photodetector and the transistors in the receiver which limit the frequency response. Minimization of parasitic capacitances is therefore critical to the design of a low-noise wide-bandwidth optical receiver.

Low-noise receivers of the integrating or transimpedance type using GaAs FETs with APD photodiodes have been reported with bandwidths of 4 GHz by B. L. Kasper, J. C. Campbell, A. H. Gnauck, A. G. Dental and J. R. Talman, In "SAGAM avalanche photodiode optical receiver for 2 Gbit/s and 4 Gbit/s", Electron. Lett., 1985, Vol. 21, pp. 982–984; and with bandwidths of 5.6 GHz by N. Ohkawa, J. -I. Yamada, and K. Hagimoto, in "Broadband GaAs FET optical front-end circuit up to 5.6 GHz", ibid., 1986, Vol. 22, pp. 259–261. A balanced dual p-i-n detector receiver for heterodyne communications has been reported with a 3 GHz bandwidth by B. L. Kasper, C. A. Burrus, J. R. Talman, and K. L. Hall in "Balanced dual-detector receiver for optical heterodyne communications at Gbit/s rates", ibid., 1986, Vol. 22, pp. 413–415.

None of these prior art optical receivers have achieved a bandwidth in excess of 7 GHz while still maintaining the low-noise required for optical transmission systems.

SUMMARY OF THE INVENTION

The optical integrating receiver of the present invention has been demonstrated to have a bandwidth of 8 GHz in a first embodiment and 16 GHz in a second embodiment, the latter thus being suitable for applications in high speed direct detection systems of up to 16 Gbit/s, as well as in very-high-capacity subcarrier-multiplexed and coherent heterodyne systems.

The receiver of the present invention uses a high input impedance three-stage cascaded FET (or the newer HEMT transistor) preamplifier configuration between an input p-i-n photodetector and a low output impedance circuit which is available for connection to the addition low impedance circuitry in which the signal is further amplified and the modulating signal detected. In order to extend the bandwidth of conventional cascaded optical receivers, the receiver of the present invention incorporates a high impedance inductive/resistive frequency enhancement network between the input photodiode and the first amplifying FET. This frequency enhancement network is also used to maximize the front end impedance by resonating with the parasitic capacitances of the photodiode and the FET, which consequently reduces channel noise which dominates at high frequencies. The first and second stages provide amplification and include microwave matching circuits which maintain the output impedance of each at an impedance that is intermediate to the high input impedance and the low output impedance. The third stage provides impedance transformation to the low impedance required at the output for connection to the additional detection circuitry. Each microwave matching circuit is a modified T-network which in one embodiment each series-arm impedance is realized as a microstrip transmission line and which in a second embodiment is realized solely as a wire bond. In the first embodiment, the shunt-leg impedances are realized by a series connected microstrip transmission line and a resistor. In the second embodiment, the shunt-leg impedances are realized by a series connected coplanar microwave transmission line and a resistor. The value of the shunt resistor and the physical characteristics of the microwave elements are determined by the characteristics of the FETs to which the modified T-networks are connected and the characteristic impedance of the stage and are chosen to maintain an essentially flat response from dc to the multi-gigahertz frequencies. Advantageously, at high frequencies the matching circuits interact with the parasitic capacitances of the FETs to maintain the extended high frequency response, while at low frequencies the matching circuits maintain the required amplification down to the dc level. Furthermore, the introduction of additional noise at each stage is reduced to a minimum.

DETAILED DESCRIPTION

Figure 1:
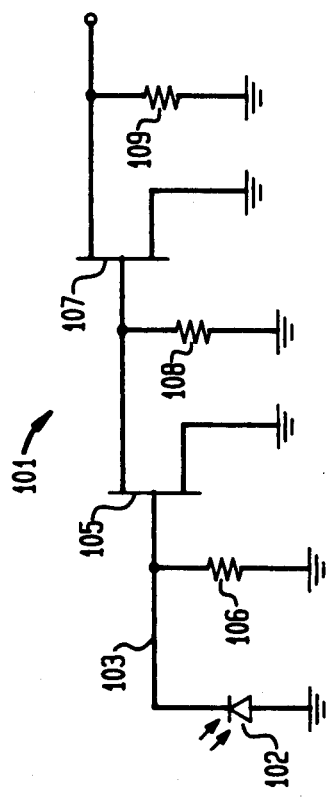
FIG. 1 is a schematic diagram of a conventional prior art GaAs FET optical receiver.

With reference of FIG. 1, the conventional prior art two-stage resistive load GaAs FET optical receiver 101 detects a received optical signal modulated with a digital information signal and linearly converts it to an electrical signal having a sufficient signal magnitude from which additional circuitry (not shown) can further amplify and accurately detect the ONEs and ZEROes of the modulating information signal. Photodiode 102 detects the optical signal received from an optical fiber or other optical transmission medium (not shown) and generates on lead 103 a low level photocurrent. This low level signal is input to a high impedance first amplifying stage consisting of FET 105 and resistor 106, the latter having high resistivity to keep the noise level of the amplified signal at a low level. The signal is further amplified by a second stage consisting of FET 107, and resistors 108 and 109, the latter resistor generally having low resistivity for impedance matching to the additional circuitry to which the output of the receiver is inputed for detection, such circuitry commonly having a low input impedance of 50 $\Omega$. Disadvantageously, the gain-bandwidth product of receivers of this type is limited by parasitic capacitance in the FET components which limits operation to a few gigahertz.

Figure 2:
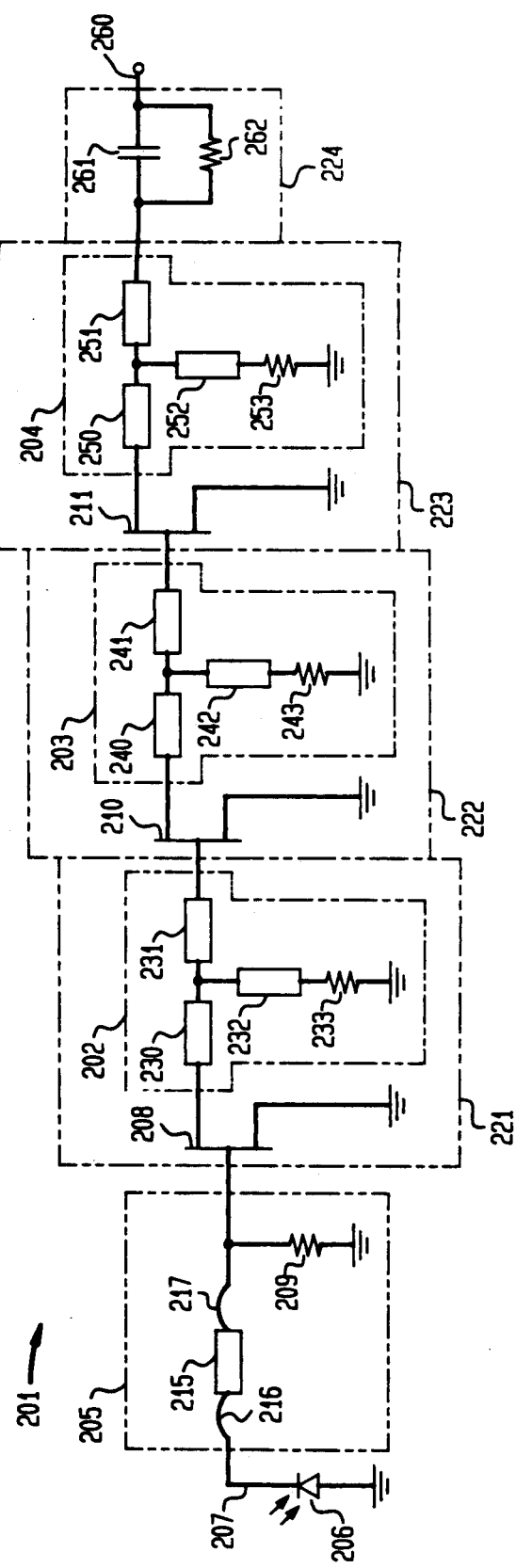
FIG. 2 is a schematic diagram of a first embodiment of a wide-bandwidth three-stage GaAs FET optical receiver with microwave matching circuitry in accordance with the present invention that has been demonstrated to have a bandwidth of 8 GHz.

The three-stage optical receiver of the present invention shown schematically in FIG. 2 substantially extends the bandwidth of the conventional two-stage optical receiver of FIG. 1 without affecting the low-frequency behavior. In particular, the receiver 201 in FIG. 2 incorporates modified T-section interstage microwave matching networks 202, 203, and 204 in stages 221, 222 and 223, respectively, and an inductive/resistive frequency enhancement network 205 at the input to stage 221 to achieve wideband performance. The configuration is a high-intermediate-intermediate-low impedance structure which achieves low noise and high frequency response.

In the schematic diagram of receiver 201 in which coupling and RC bypass capacitors used for biasing purposes are eliminated for purposes of clarity, photodiode 206 is responsive to an incident optical signal from an optical transmission medium (not shown). The resultant photocurrent generated on lead 207 is input to frequency enchancement network 205 which includes a peaking circuit comprising a microstrip transmission line 215 in series with wire bonds 216 and 217, and a high resistivity resistor 209. The output of network 205 is connected to the input of the first stage 221 which consists of FET 208 and matching network 202. The inductance of the peaking circuit resonates with the parasitic capacitance of the photodiode 206 and FET 208 to enhance the high frequency response of the input stage by providing a flat frequency response over the required bandwidth. Advantageously, this enhanced gain at high frequencies also results in a significantly improved signal-to-noise ratio. By precisely controlling the inductance of the peaking circuit which is realized, as aforenoted, as a microstrip transmission line 215 with two wire bonds 216 and 217, the frequency region in which the bandwidth of the receiver is to be extended can be accurately determined.

Since the input impedance of stage 221 at the input to FET 208 is determined by the value of bias resistor 209 in network 205, employing a large resistor (e.g. 5 k$\Omega$) maintains the noise current of the amplifier stage at a minimum value while FET 208 provides amplification over the extended bandwidth. The output of FET 208 in the first stage is at an impedance intermediate to the high input impedance and the low (50 $\Omega$) output impedance and would generally be approximately 100 $\Omega$ and be determined by microwave matching network 202. Matching network 202 is a modified T-network consisting of, as the series-arm impedances, microstrip transmission line impedances 230 and 231, and as the shunt-leg impedance, microstrip transmission line impedance 232 in series with resistor 233. In addition to providing a load impedance to FET 208 at the intermediate impedance, the transmission line elements of matching network 202 resonate at high frequencies with the output parasitic capacitances of the first FET 208 and with the input parasitic capacitances of FET 210 in the second stage 222. Accordingly, the effect of the FET parasitic capacitances are offset and the bandwidth is extended to the same degree that circuit 205 extends the bandwidth at the input to stage 221. At low frequencies the transmission line elements have little effect and the load impedance is determined in part by resistor 233 and thereby defines the gain of stage 221 at low frequencies. Thus, since optical receivers require bandwidth down to almost the dc level, the presence of resistor 233 is critical to the satisfactory performance of the receiver.

Stage 222 consisting of FET 210 and microwave matching network 203 provides additional gain and an intermediate impedance output. Matching network 203 is also a modified T-section network consisting of series-arm microstrip transmission line impedances 240 and 241, and microstrip transmission line impedance 242 in series with resistor 243 as the shunt-leg impedance. Matching network 203 provides a load impedance to FET 210 at the intermediate impedance. As in stage 221, the transmission line elements of matching network 203 resonate with the output parasitic capacitances of FET 210 and the input parasitic capacitances of FET 211 in the output stage 223 to extend the bandwidth. Resistor 243 determines the load impedance and defines the gain of stage 222 at low frequencies.

Advantageously, by maintaining the output impedance of the first and second stages 221 and 222 at an impedance level intermediate to the high input impedance and the low output impedance, the thermal noise contribution from the resistance of each successive stage is reduced. Particularly, maintaining the impedance of intermediate stages at a higher value than the 50 $\Omega$ output impedance results in lower noise contributions for those stages that follow the front end stage and lower overall noise for the optical receiver. Three stages are therefore preferable to two stages because the contribution of noise from the post amplifier following the receiver is reduced essentially by the gain of the additional stage, and can be made negligible which is not always the case for a two stage receiver. Since noise performance at high frequencies will limit operation at high bit rates, minimization of noise contributions is critical in achieving acceptable performance characteristics.

The third stage 223, consisting of FET 211 and microwave matching network 204, provides impedance transformation from the intermediate impedance of stage 222 to the desired low output impedance of stage 223 at the necessary 50 Ω. As previously noted, a 50 Ω output is required to provide a high return loss when the receiver is connected to conventional 50 Ω amplification and detection circuitry. Output matching circuit 204 is a modified T-network, similar to matching circuits 202 and 203, and consists of microstrip transmission line impedances 250 and 251 as the series-arm impedances and microstrip transmission line impedance 252 in series with resistor 253 as the shunt-leg impedance. Resistor 253 maintains the low frequency performance of FET 211 and microstrip transmission line impedances 250, 251 and 252 transform the intermediate impedance at the input to FET 211 to the desired low 50 Ω output impedance. As in matching circuits 202 and 203, the microstrip transmission line impedances of circuit 204 interact with the output parasitic capacitances of FET 211 to extend the bandwidth. RC network 224 connected between matching circuit 204 and output 260 of the receiver and consisting of resistor 262 in parallel with capacitor 261 provides RC equilization at the output that serves to compensate for a low frequency rise in response.

Microstrip transmission line impedances 205, 230, 231, 232, 240, 241, 242, 250, 251, and 252 and resistors 233, 243, and 253 are optimized using standard circuit design methodology. In particular the dimensions of the microstrip transmission line impedances and the value of the resistors can be determined using the TOUCHSTONE microwave simulation program or the SUPERCOMPACT program. The TOUCHSTONE program is a produce of EEsof, Inc., and the SUPERCOMPACT program is a product of Compact Software, Inc. Inputs to the programs include the circuit configuration, the substrate parameters, the photodiode capacitance, and the S-parameters of the transistors. The program will output the optimum values for the width and length of the microstrip transmission lines and the values of the resistances for maximum gain and bandwidth.

Since the physical parameters of the transmission line impedances are dependent in part on the dielectric constant of the substrate material, it has been found that normal substrate materials such as alumina will result in dimensions for the transmission lines that are physically difficult to realize. Accordingly, a low dielectric material is required as a substrate material to achieve realizable structures. In the preferred embodiment of the invention, quartz has been employed as a substrate material that has a low dielectric constant with low parasitic capacitance.

Figures 3A, 3B:
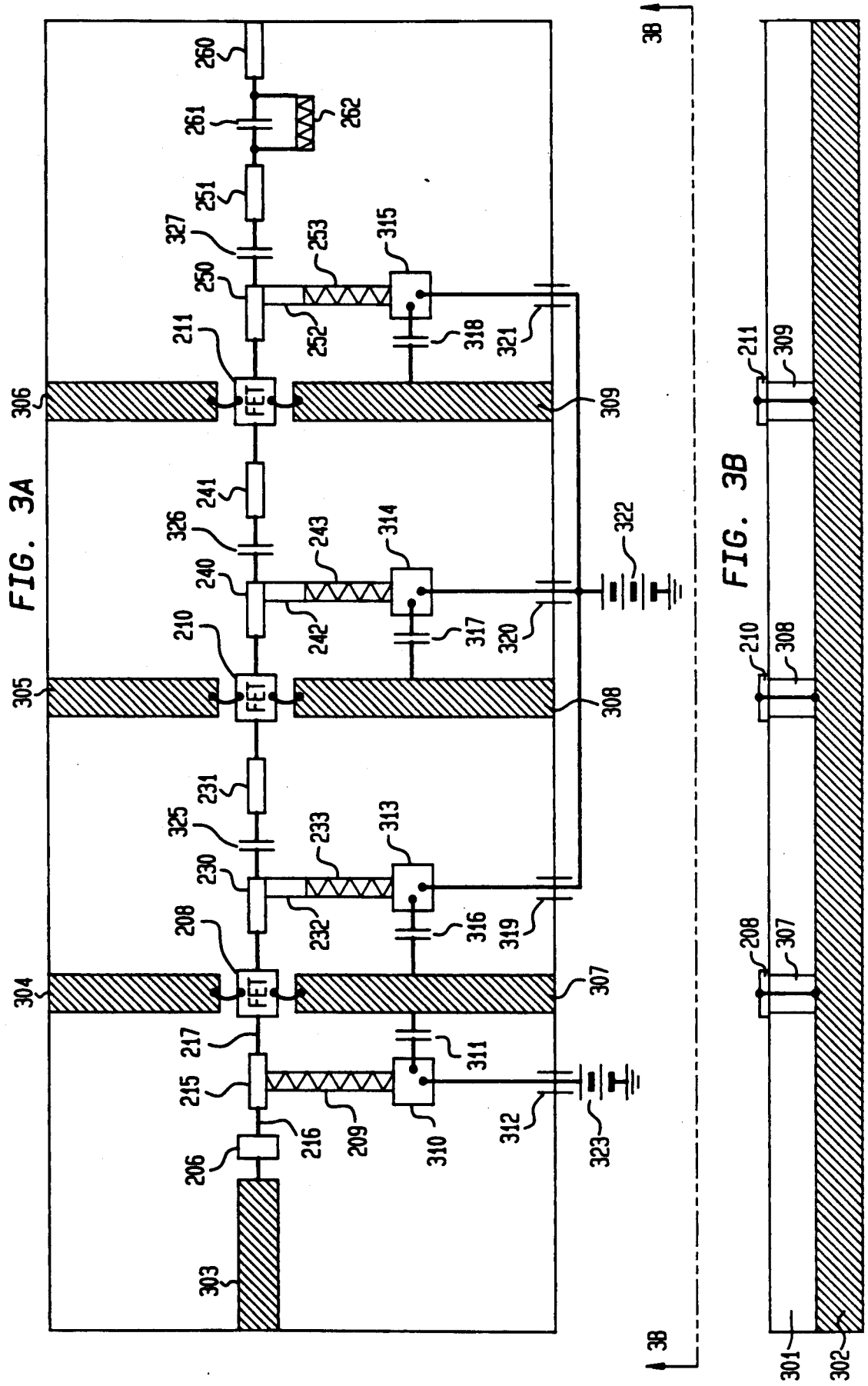
FIG. 3A is a hybrid integrated circuit layout diagram of the top view of the receiver of FIG. 2 as it is arranged on a substrate and showing the microwave stripline transmission line implementations of the interstage matching circuitry.
FIG. 3B is a side view of FIG. 3A showing the substrate mounted on a conductive mounting block.

With reference to the hybrid integrated circuit layout diagram in FIG. 3A, the circuit elements in the schematic drawing of FIG. 2 are shown as components disposed on a quartz substrate 301. Substrate 301 is mounted on a brass mounting block 302, shown in the side view of FIG. 3A in FIG. 3B, which provides a ground plane to which the circuit elements are connected. Similar numerical designations are given in FIGS. 3A and 3B to those elements also represented in FIG. 2. Substrate 301 includes slots 303–309 for providing quick access from the components disposed on the surface of the substrate to the ground plane for purposes of providing low inductance grounding for the photodiode 206 and FETs 208, 210, and 211.

The inductive peaking circuit is implemented as noted in FIG. 3A, by a wire 216/microstrip line 215/wire 217 series inductance connected between photodiode 206 and FET 208. Such implementation provides gain peaking as aforenoted, and lower noise than a conventional integrating receiver. In addition the inductance of this configuration can be more precisely controlled than can a wire inductance. Such precise control is necessary to achieve a wide flat bandwidth response. In addition, use of quartz as a substrate material minimizes the capacitance of the transmission line for lowest noise and widest bandwidth.

Input resistor 209, implemented as a thin film resistor, is connected between microstrip line 215 and a gold bond pad 310. Pad 310 is connected through capacitor 311 to the grounding plane 302 through slot 307 to provide a signal path to ground for AC signals. Pad 310 is also connected through pass-through 312 to a source of potential 323 for biasing photodetector 206, typically 10–100 volts. Resistors 233, 243, and 253, implemented as thin film resistors are connected to bonding pads 313, 314 and 315, through capacitors 316, 317, and 318, to grounding plane 302 through slots 307, 308, and 309, respectively, to provide short paths to ground for AC signals. In addition, pads 313, 314, and 315 are connected through pass-throughs 319, 320, and 321, respectively, to a source of FET drain bias potential, 322, typically 5 volts. In order to block the DC drain bias of each FET from the adjacent FET, capacitors 325, 326, and 327 are connected between the seriesarm transmission line impedances 230 and 231, 240 and 241, and 250 and 251, respectively. Capacitors 311, 316, 317, 318, 325, 326 and 327 are lumped elements, typically 100–1000 nF. To simplify the circuit layout in FIG. 3A, the high impedance thin film resistors which provide DC gate bias to FETs 208, 210, and 211 are not shown.

Figure 4:
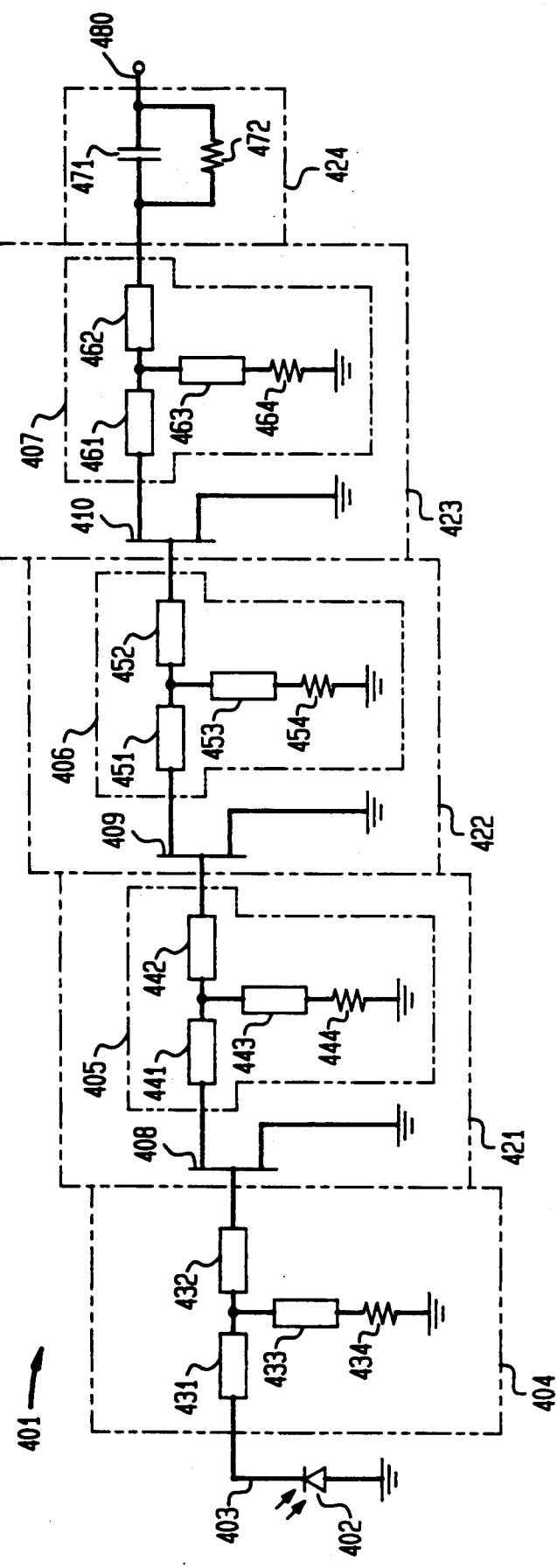
FIG. 4 is a schematic diagram of a second embodiment of a wide bandwidth three-stage HEMT optical receiver with microwave matching circuitry in accordance with the present invention that has been demonstrated to have a bandwidth of 16 GHz.

A second embodiment of the present invention, shown schematically in FIG. 4, has been demonstrated to have a performance capability that exceeds that of FIG. 2. in particular, the optical receiver in FIG. 4 has achieved a bandwidth of 16 GHz, almost double the bandwidth achieved by the embodiment in FIG. 2, which itself substantially improved upon the bandwidths obtained by prior art optical receivers. Structurally, optical receiver 401 is essentially identical to receiver 201 in FIG. 2, consisting of three transistor stages 421, 422 and 423. Stages 421, 422 and 423 each include an HEMT transistor (408, 409 and 410) connected as a common source amplifier and a modified T-section microwave matching circuit (405, 406 and 407). As in the embodiment of FIG. 2, matching circuit 405 provides matching to an intermediate impedance second stage 422 and matching circuit 406 provides this same intermediate impedance at the input of the third output stage 423. Matching circuit 407 in stage 423 provides impedance transformation to the desired 50 Ω output.

An inductive/resistive modified T-section matching network 404 comprising inductive elements 431 and 432 as series-arm impedances and an inductive microwave element 433 in series with resistor 434 as the shunt-leg impedance is employed in this embodiment as the frequency enhancement network connected between the input p-i-n photodiode 402 and the input to the first amplifying stage 421. As frequency enhancement network 205 in FIG. 2 enhances the frequency response of the first stage while providing a high input impedance to reduce the noise, network 404 is similarly used to maximize the front end impedance by resonating with the parasitic capacitances of the photodiode and HEMT 409 in the first stage, while consequently helping to reduce the FET channel noise which dominates at high frequencies. In addition, element 433 which is essentially inductive, blocks the high frequency noise generated by the resistor 434 thereby improving the overall sensitivity of the receiver. Matching networks 405, 406 and 407 extend the receiver bandwidth while maintaining uniform gain down to low frequencies as do their counterparts, 202, 203 and 204, in receiver 201 in FIG. 2. By employing coplanar thin film hybrid integrated circuit technology to reduce the stray parasitic circuit capacitance however, the bandwidth of the receiver is able to be doubled over the bandwidth of the receiver of FIG. 2. Thus in receiver 401, microwave elements 433, 443, 453 and 463 in the shunt-legs of the modified-T matching networks are realized as coplanar waveguides while the seriesarm inductances, 431, 432, 441, 451, 452, 461 and 462, are realized soley by wire bonds.

As in receiver 201, an RC network 434 consisting of resistor 472 in parallel with capacitor 471 and connected between the output of stage 423 and receiver output 480, serves to compensate for a low frequency rise in response.

As in the embodiment of the present invention of FIG. 2, the inductance values of series-arm impedances 431, 432, 441, 442, 451, 452, 461, and 462, the resistance values of resistors 434, 444, 454 and 464, and the impedance values of the coplanar waveguide elements 433, 443, 453 and 463 are optimized using standard circuit design methodology. The physical characteristics of the waveguide elements can be determined using one of the aforenoted microwave simulation programs.

Figures 5A, 5B:
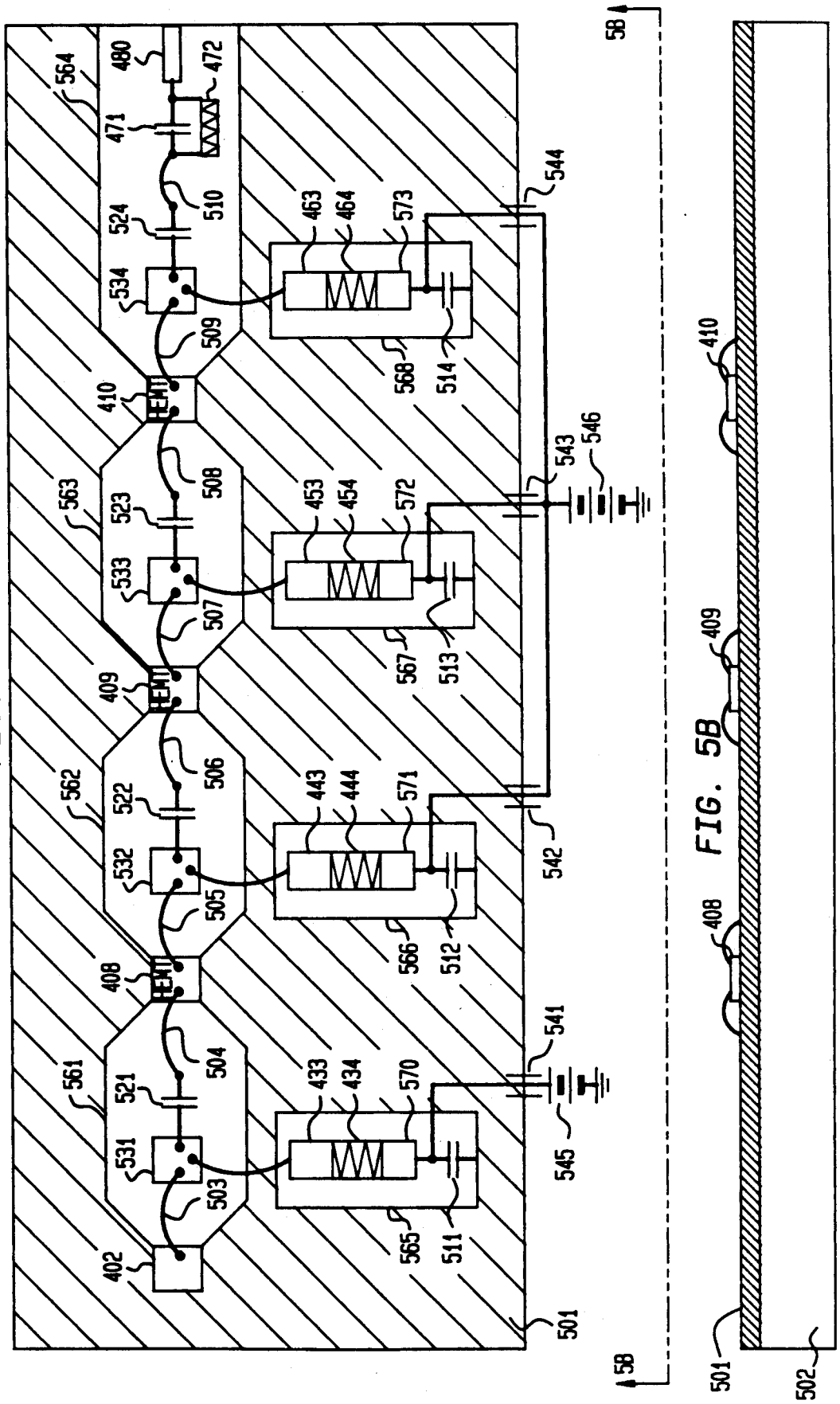
FIG. 5A is a hybrid integrated circuit layout diagram of the top view of the receiver of FIG. 4 as it is arranged on a substrate and showing as the implementation of the interstage matching circuitry, wire-bonds as the series-arm impedances, and a coplanar microwave transmission line in series with a line film resistor as the shunt-leg impedances of the modified T-networks.
FIG. 5B is a side view of FIG. 5A.

With reference to the hybrid integrated circuit layout diagram in FIGS. 5A and 5B, the circuit elements in the schematic drawing of FIG. 4 are shown as components mounted on a low dielectric quartz substrate 502. A metallic conductive plane 501 is disposed on top of the substrate 502 with cutouts 561, 562, 563, 564, 565, 566, 567, and 568 provided for mounting the components on the dielectric substrate. Similar numerical designations are given in FIGS. 5A and 5B to those elements also represented in FIG. 4.

The input inductive/resistive network 404 connected between the photodiode 402 and the gate of HEMT 408 is implemented, as noted in FIG. 5A, as a modified T-section consisting of a wire bond 503 connected between photodiode 402 and gold bond pad 531 as series-arm impedance 431. Series arm impedance 432 is implemented by wire bond 504 connected to HEMT 408 and pad 531 through a capacitor 521, the latter serving to block the DC current of the photodiode from the gate of HEMT 408. The shuntleg impedance of the modified T-network is implemented as coplanar waveguide 433 disposed in cutout 565 between the surrounding ground plane, and thin film resistor 434. Resistor 434 is connected through bonding pad 570 and through passthrough 541 to a source of potential 545 for biasing photodetector 402. A capacitor 511 connected between pad 570 to the grounding plane 501 provides a signal path go ground of AC signal.

The modified T-section matching networks 405, 406 and 407 in FIG. 4 are similarly implemented. Thus the series-arm impedances 441, 442, 451, 452, 461, and 462 are implemented as wire bonds 505, 506, 507, 508, 509 and 510, respectively. The shuntleg impedances are similarly implemented as coplanar waveguides 443, 453, and 463 in series with thin film resistors 444, 454, and 464, as disposed in cutouts 566, 567, and 568, respectively. Resistors 444, 454, and 464 are connected through pads 571, 572, and 573 and through capacitors 512, 513 and 514, respectively, to ground plane 501, to provide short paths to ground for AC signals. Pads 571, 572 and 573 are also connected, through passthroughs 542, 543 and 544, to a source of HEMT drain bias potential 546. In order to block the DC drain bias of each HEMT from the adjacent HEMT, capacitors 522, 523 and 524 are connected between the series-arm wirebond elements.

In the above-described embodiments of the present invention, FET or the newer HEMT amplifiers were used in the three stages of the receiver. Other transistor amplifiers could also be employed to achieve the advantageously wideband, low-noise results of the present invention. In addition, low dielectric constant substrates other than quartz could be employed in fabricating the hybrid integrated circuit. The circuit could also be fabricated on an integrated circuit or on an opto-electronic integrated circuit.

The above-described embodiments are illustrative of the principles of the present invention. Other embodiments could be devised by those skilled in the art without departing from the spirit and scope of the present invention.

What is claimed is:

1. An optical receiver having a bandwidth that extends from near dc to the multi-gigahertz range for converting a received optical signal to an amplified electrical signal at the output of the receiver, said receiver comprising:

photodetector means for converting the received optical signal to a proportional low-level electrical signal, inductive/resistive frequency enhancement means connected to said photodetector means for extending the high frequency response of a first stage of an amplifying means and for providing a high input impedance to said first stage, said amplifying means being connected between said frequency enhancement means and said receiver output and comprising a plurality of amplifying stages each comprising a transistor amplifier and a microwave matching circuit comprising a modified T-network having as series-arm impedances inductive elements and as a shunt-leg impedance a microwave element in series with a resistor, said amplifying stages providing individual input and output impedances decreasing successively from said high input impedance at said first of said stages to a low output impedance at the last of said stages, the resistor in the shunt-leg of each modified T-network being chosen to extend the bandwidth of each stage to near the dc level and the values of said inductive and microwave elements being chosen to preserve the high frequency response as extended by said frequency enhancement means.

2. An optical receiver in accordance with claim 1 wherein the transistor amplifier in each of said amplifying stages is an FET or an HEMT.

3. An optical receiver in accordance with claim 1 wherein said frequency enhancement means comprises an inductive peaking means.

4. An optical receiver in accordance with claim 3 wherein said inductive peaking means comprises a microstrip transmission line in series with wire bonds at its input and output.

5. An optical receiver in accordance with claim 4 wherein the microwave elements in the modified T-networks are microstrip transmission lines.

6. An optical receiver in accordance with claim 1 wherein said frequency enhancement means comprises a modified T-network having as series-arm impedances inductive elements and as a shunt-leg impedance a microwave element in series with a resistor.

7. An optical receiver in accordance with claim 6 wherein the inductive element in each modified T-network is a wire bond.

8. An optical receiver in accordance with claim 7 wherein the microwave element in each modified T-network is a coplanar waveguide.

9. An optical receiver having a bandwidth that extends from near dc to the multi-gigahertz range for converting a received optical signal to an amplified electrical signal at the output of the receiver comprising:

photodetector means for converting the received optical signal to a proportional low-level electrical signal, inductive/resistive frequency enhancement means connected to said photodetector means for extending the high frequency response of a first amplifying stage and for providing a high input impedance to said first amplifying stage, said first amplifying stage having said high input impedance and an intermediate output impedance for amplifying the enhanced low-level electrical signal, said first amplifying stage comprising a first transistor amplifier and a first output microwave matching circuit for providing said intermediate impedance, said first output microwave matching circuit comprising a modified T-network having a series-arm impedances inductive elements and as a shunt-leg impedance a microwave element in series with a resistor, a second amplifying stage cascaded with said first stage having an intermediate input impedance and an intermediate output impedance for further amplifying the enchanced low-level electrical signal amplified by said first amplifying stage, said second amplifying stage comprising a second transistor amplifier and a second output microwave matching circuit for providing said intermediate impedance, said second output microwave matching circuit comprising a modified T-network having as series-arm impedances inductive elements and as a shunt-leg impedance a microwave element in series with a resistor, and a third amplifying stage cascaded with said first and second stages having an intermediate input impedance and a low output impedance at the receiver output for providing an impedance transform to the amplified enchanced electrical signal, said third amplifying stage comprising a third transistor amplifier and a third output microwave matching circuit for providing said low output impedance, said third amplifying stage comprising a third transistor amplifier and a third output microwave matching circuit for providing said low impedance, said third output microwave matching circuit comprising a modified T-network having as series-arm impedances inductive elements and as a shunt-leg impedance a microwave element in series with a resistor, the resistor in each of said modified T-networks being chosen to extend the bandwidth of each stage to near the dc level and the inductive and microwave elements in each of said modified T-networks being chosen to preserve the high frequency response of each stage as extended by said frequency enhancement means.

10. An optical receiver in accordance with claim 9 wherein said transistor amplifiers in said first, second and third amplifying stages are FETs or HEMTs.

11. An optical receiver in accordance with claim 9 wherein said frequency enhancement means comprises inductive peaking means.

12. An optical receiver in accordance with claim 11 wherein said inductive peaking means comprises a microstrip transmission line in series with wire bonds at its input and output.

13. An optical receiver in accordance with claim 12 wherein the microwave elements in each of said modified T-networks is a microstrip transmission line.

14. An optical receiver in accordance with claim 9 wherein said frequency enhancement means is a modified T-network having as series-arm impedances inductive elements and as a shunt-leg impedance a microwave element in series with a resistor.

15. An optical receiver in accordance with claim 14 wherein the inductive elements in each modified T-network is a wire bond.

16. An optical receiver in accordance with claim 15 wherein the microwave element in each modified T-network is a coplanar waveguide.

* * * * *